(12) United States Patent
Hamada

(10) Patent No.: US 8,182,117 B2
(45) Date of Patent: May 22, 2012

(54) LIGHT EMITTING ELEMENT, LIGHT EMITTING ELEMENT ARRAY, BACKLIGHT UNIT, AND LIQUID CRYSTAL DISPLAY DEVICE

(75) Inventor: Tetsuya Hamada, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 581 days.

(21) Appl. No.: 12/304,292

(22) PCT Filed: Feb. 19, 2007

(86) PCT No.: PCT/JP2007/052932
§ 371 (c)(1),
(2), (4) Date: Dec. 11, 2008

(87) PCT Pub. No.: WO2008/023467
PCT Pub. Date: Feb. 28, 2008

(65) Prior Publication Data
US 2009/0201440 A1 Aug. 13, 2009

(30) Foreign Application Priority Data
Aug. 24, 2006 (JP) .................................. 2006-228378

(51) Int. Cl.
*F21V 7/00* (2006.01)
(52) U.S. Cl. ............... 362/296.01; 362/311.02; 362/97.3

(58) Field of Classification Search ............. 362/296.01, 362/311.02
See application file for complete search history.

(56) References Cited

U.S. PATENT DOCUMENTS

| | | | |
|---|---|---|---|
| 2005/0133808 A1* | 6/2005 | Uraya et al. | 257/99 |
| 2006/0163596 A1 | 7/2006 | Kim et al. | |
| 2007/0040182 A1* | 2/2007 | Lee | 257/98 |
| 2007/0081321 A1* | 4/2007 | Ahn et al. | 362/97 |

FOREIGN PATENT DOCUMENTS

| | | |
|---|---|---|
| CN | 1612369 A | 5/2005 |
| CN | 1811558 A | 8/2006 |
| JP | 2000-012910 A | 1/2000 |
| JP | 2003-187624 A | 7/2003 |
| JP | 2006-064733 A | 3/2006 |
| JP | 2006-093626 A | 4/2006 |

OTHER PUBLICATIONS

Official Communication issued in International Patent Application No. PCT/JP2007/052932, mailed on Apr. 17, 2007.

* cited by examiner

*Primary Examiner* — Evan Dzierzynski
(74) *Attorney, Agent, or Firm* — Keating & Bennett, LLP

(57) ABSTRACT

A light emitting includes a bump-shaped slug having a support plane at the top of the bump-shaped slug. The slug includes side planes arranged to function as optical action planes arranged to receive and reflect a portion of the light from the light emitting chip.

8 Claims, 17 Drawing Sheets

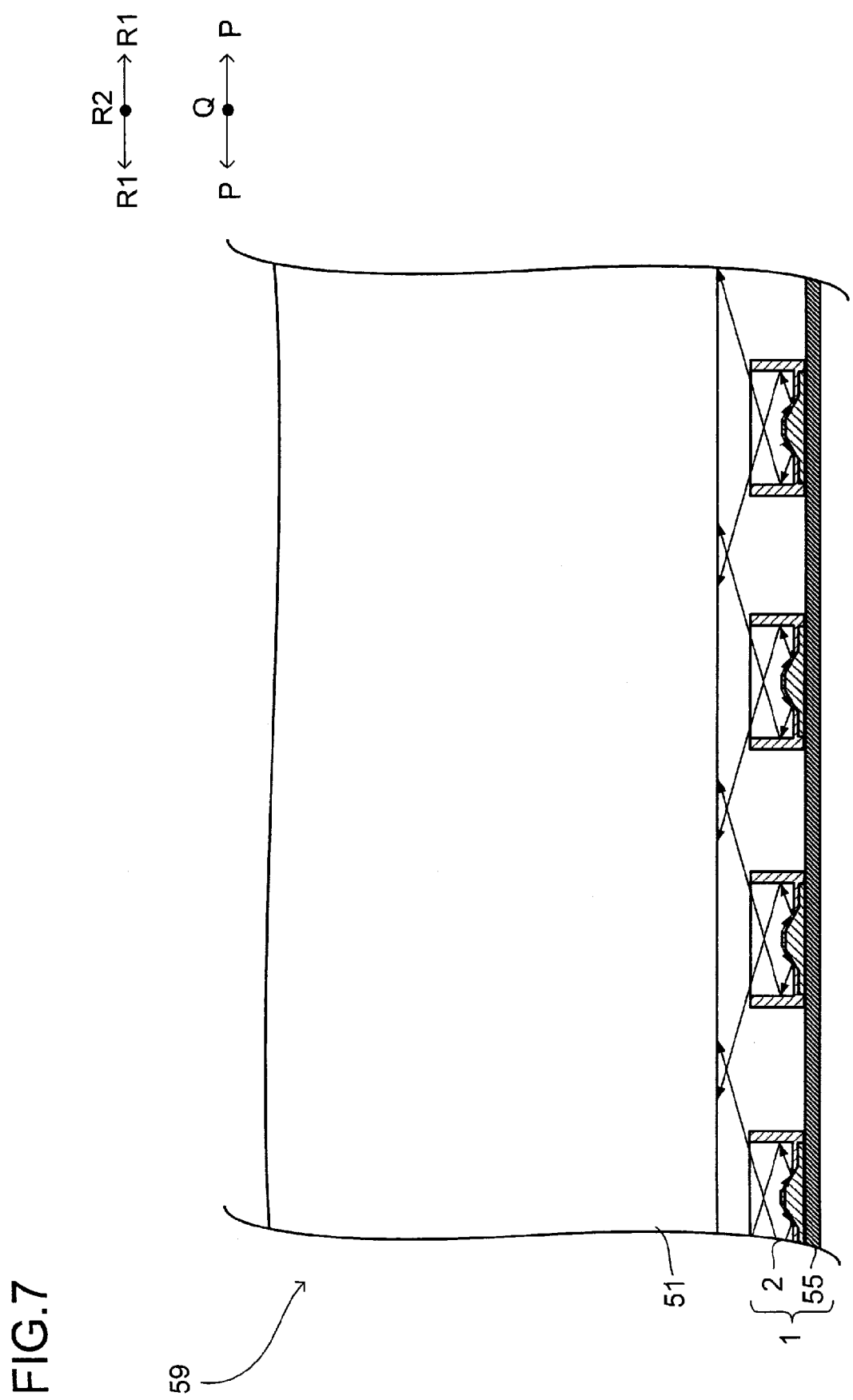

LIGHT EMITTING ELEMENT, LIGHT EMITTING ELEMENT ARRAY, BACKLIGHT UNIT, AND LIQUID CRYSTAL DISPLAY DEVICE

BACKGROUND OF THE INVENTION

1. Field of the Invention

The present invention relates to a light emitting element, a light emitting element array having a plurality of the light emitting elements, a backlight unit that receives light from the light emitting element array, and a liquid crystal display device including the backlight unit.

2. Description of the Related Art

Conventionally, a flat liquid crystal display device incorporates, for example, a sidelight-type backlight unit that has a light guide plate, and an LED (light emitting element) array which emits light to a side end of the light guide plate (e.g., JP-A-2006-64733). Such a backlight unit includes an LED array having a plurality of LEDs 102, for example, shown in FIGS. 16A to 16C (FIG. 16A is a perspective view, FIG. 16B is a plan view of FIG. 16A, and FIG. 16C is a sectional view taken along the a-a' line in FIG. 16B).

Usually, as shown in FIGS. 16A to 16C, a light emitting chip 121 is mounted on a bottom portion 131 of a package 126 of the LED (light emitting element) 102 via a slug 122. As shown in FIGS. 17A, 17B (sectional views seen from the same direction as that of FIG. 16C), a portion of the light emitted from the light emitting chip 121 is reflected a plurality of times by an inner wall surface 133 of the package 126, and travels to an opening op of the package 126. For example, FIG. 17A shows an optical path of light (one-dot-one-bar line) that travels in an elevation angle direction, and FIG. 17B shows an optical path of light (two-dot-one-bar line) that travels in a depression angle direction.

Accordingly, besides the light (solid line) that travels from the light emitting chip 121 directly to the opening op of the package 126, the other light (which travels from the light emitting chip 121 to the inner wall surface 133 or the like) also advances to the opening op, and thereby a sufficient amount of light enters the light guide plate through a side end thereof.

However, except for the light that travels from the light emitting chip 121 directly to the opening op of the package 126, the other light is reflected a plurality of times by the inner wall surface 133 of the package 126 before it reaches the opening op. Accordingly, the inner wall surface 133 made of a resin of the package 126 is hit by the light many times, thereby the inner wall surface 133 is deteriorated by the light (light deterioration). Such light deterioration lowers the reflectance of the inner wall surface 133, and reduces the amount of incident light into the light guide plate.

SUMMARY OF THE INVENTION

Preferred embodiments of the present invention have been developed to solve the above problems, and provide a light emitting element that prevents and minimizes light deterioration of a resin package (housing member) due to the light from a light emitting chip, a light emitting element array incorporating the light emitting element, a backlight unit including the light emitting element array, and a liquid crystal display device including the backlight unit.

A light emitting element according to a preferred embodiment of the present invention provides a housing member having an opening, a light emitting chip, and a base portion arranged to support the light emitting chip. The base portion of the light emitting element includes a support surface arranged to support the light emitting chip, and preferably has a bump shape (raised shape) with the support surface as the top. An outer side surface of the raised shape defines an optical action surface that receives a portion of the light from the light emitting chip and reflects it.

Usually, the light emitting chip emits light in various directions. Accordingly, in a case where the light emitting chip is housed in the housing member, because the light is reflected by a wall portion of the housing member, the light travels around inside the housing member and sometimes advances toward the base portion supporting the light emitting chip.

However, the side surface of the raised-shape base portion having the support surface as the top defines an optical action surface (e.g., a reflective surface). Accordingly, light, which is a portion of the light advancing toward the base portion and hits the optical action surface, is reflected by the optical action surface and advances in another direction. Because the advance direction is a direction leading to the opening, the light does not travel around inside the housing member. Accordingly, chances that the light reaches the wall portion of the housing member decrease, thereby the light deterioration of the wall portion caused by the light can be prevented and minimized.

It is desirable that the raised-shape base portion protrudes from a bottom portion of the housing member toward the opening and is tapered with the support surface as the top.

As described above, because the top of the base portion, that is, the support surface, comes close to the opening, the light emitting chip disposed on the support surface also comes close to the opening. Accordingly, the light from the light emitting chip also easily reaches the opening. Besides, the side surface of the tapered base portion having the support surface as the top on which the light emitting chip is disposed to be inclined as to look up at the opening. Accordingly, light that hits the side surface of the base portion easily travels to the opening.

It is desirable that the tapered base portion has a conical shape. As described above, light reflected by the side surface of the base portion extends radially with respect to the base portion. Accordingly, the emitted light from the light emitting chip extends widely, and easily enters a light guide plate or the like. The optical action surface may be a curved surface or a flat surface.

Besides, in a case where a light-transmissive sealing member is arranged to cover the light emitting chip, it is desirable that a height H1 of the sealing member from the bottom surface of the housing member and a height H2 of the wall portion of the housing member from the bottom surface of the housing member (as shown in FIGS. 11A and 11B) meet the following conditional expression:

$$H1 \geq H2 \qquad \text{conditional expression (1)}$$

Usually, because the sealing member is arranged to fill the inside of the housing member, the height H1 of the sealing member and the height H2 of the wall portion of the housing member are often equal to each other. However, if the light emitting element meets the conditional expression (1), it can be considered that the upper end of the wall portion, which leads to the opening, of the housing member is cut away. Accordingly, light that would be blocked by the upper end of the wall portion is not reflected by the upper end and travels to the outside. Consequently, the emitted light from the light emitting element extends widely and easily enters a light guide plate or the like.

It is desirable that at least a portion of the inner wall surface of the wall portion of the housing member has a tilted surface that is inclined looking up at the opening. As described above, light that hits the tilted surface is easily reflected to the opening.

Further, it is desirable that a metal electrode, which serves as a path for an electric current flowing through the light emitting chip, is disposed on at least one of the bottom surface and the tilted surface of the housing member. As described above, the metal electrode prevents light from hitting the housing member, and thereby the light deterioration of the housing member can be surely prevented and minimized.

A light emitting element array including a plurality of the light emitting elements is also provided by a preferred embodiment of the present invention. In a case where the light emitting elements are arranged in a line in the light emitting element array, it is desirable that the optical action surfaces of the different light emitting elements of the adjoining light emitting elements oppose each other and are arranged in a line.

As described above, light reflected by the optical action surfaces of the different light emitting elements extends in the same direction as a whole. And the extending direction of light agrees with the direction (array direction) in which the light emitting elements are arranged. Therefore, the light emitted from the light emitting elements extends in the array direction of the light emitting element array as a whole. Accordingly, because the longitudinal direction of a side end of a light guide plate agrees with the array direction, the light enters the light guide plate from substantially the entire region extending in the longitudinal direction thereof. Consequently, a light emitting element array which prevents and minimizes unevenness of the light amount traveling out of the light guide plate can be achieved.

Besides, a backlight unit including the light emitting element array described above and a light guide plate which receives light from the light emitting element array and guides the light to the outside is also provided by a preferred embodiment of the present invention. Further, a liquid crystal display device including a liquid crystal display panel which receives the light guided by the backlight unit is also provided by a preferred embodiment of the present invention.

According to a preferred embodiment of the present invention, light can be guided by the side surface (optical action surface) of the base portion to the opening of the housing member. Accordingly, chances that the light hits the wall portion and the like of the housing member decrease, and thereby the light deterioration of the housing member can be minimized.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 7 is a sectional view of a backlight unit according to a preferred embodiment of the present invention taken along the C-C' line in FIG. 15 described later.

DETAILED DESCRIPTION OF THE PREFERRED EMBODIMENTS

First Preferred Embodiment

A preferred embodiment of the present invention is explained below with reference to selected figures. For the sake of convenience, reference numbers and hatching are not used in some of the figures. In such a case, other figures should be referred to. Black dots in some figures are meant to indicate a direction perpendicular to the paper surface.

Figure 15:
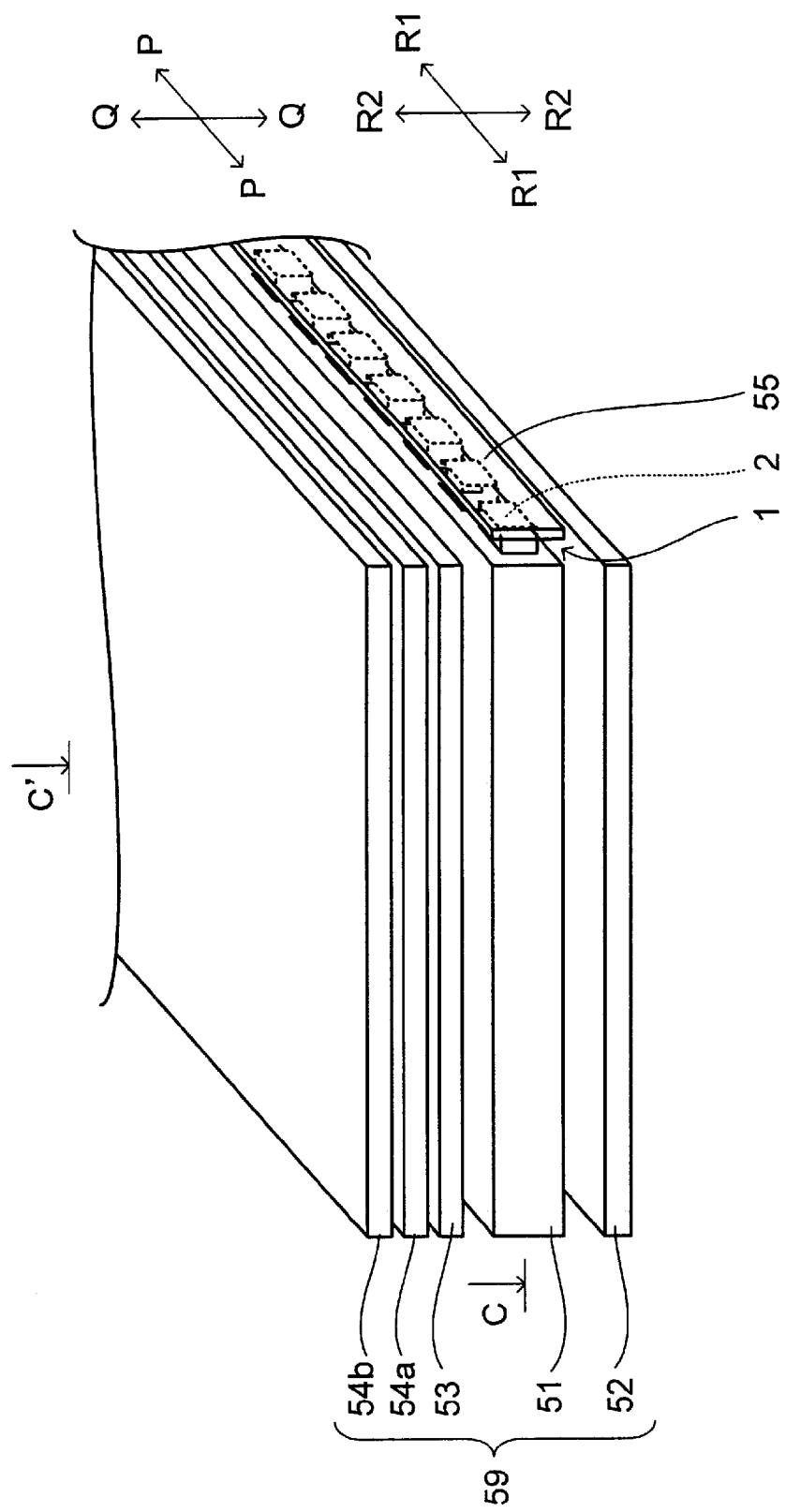
FIG. 15 is a perspective view of a backlight unit according to a preferred embodiment of the present invention.
Figure 16A:
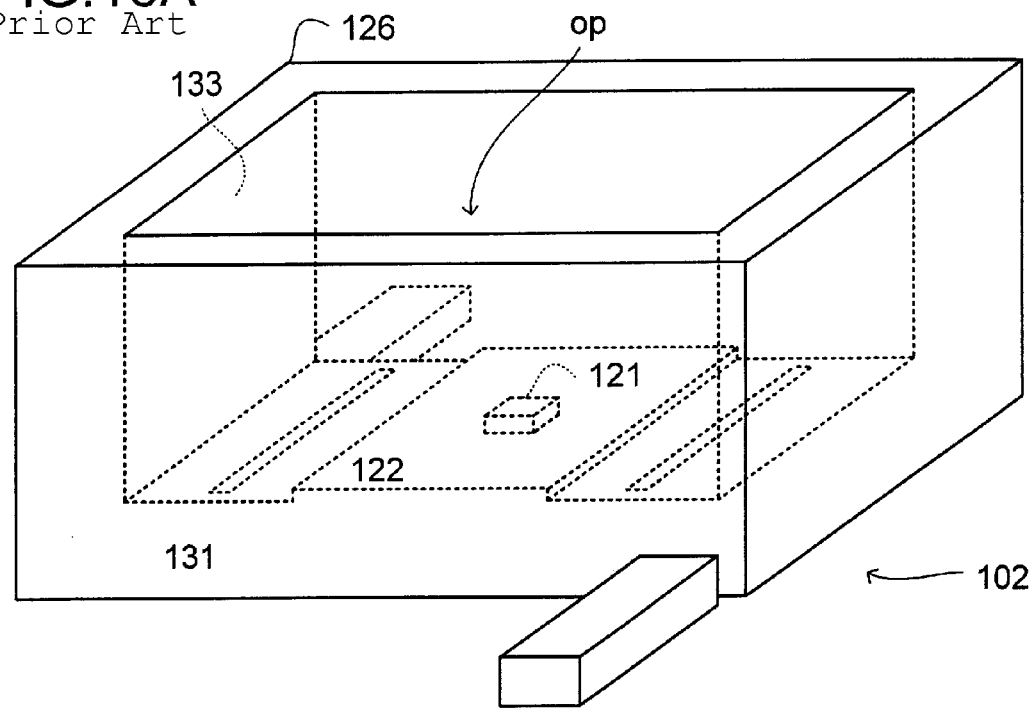
FIG. 16A is a perspective view of a conventional LED.
Figure 16B:
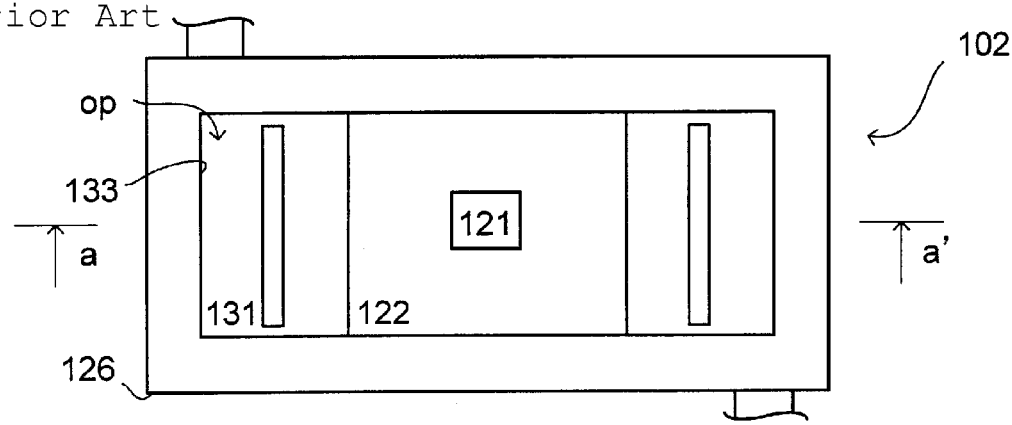
FIG. 16B is a sectional view taken along the line a-a' in FIG. 16A.
Figure 16C:
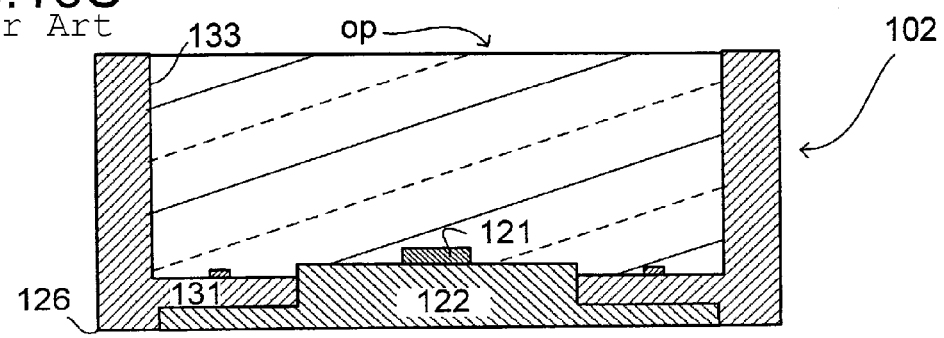
FIG. 16C is a sectional view taken along the line b-b' in FIG. 16A.
Figure 17A:
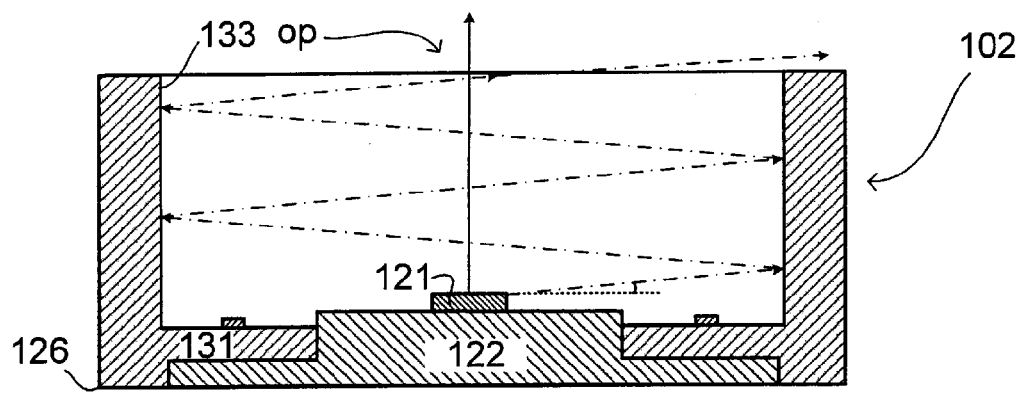
FIG. 17A is an optical path view of light which travels from a light emitting chip of a conventional LED in an elevation angle direction.
Figure 17B:
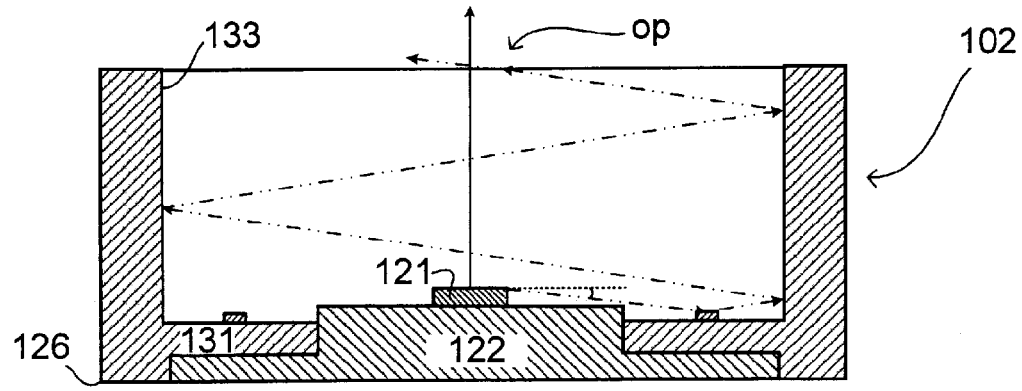
FIG. 17B is an optical path view of light which travels from a light emitting chip of a conventional LED in a depression angle direction.

Usually, a liquid crystal display device includes a liquid crystal display device panel and a backlight unit. FIG. 15 shows a backlight unit 59.

The backlight unit 59 emits light (backlight) toward a liquid crystal display panel. The backlight unit 59 includes an LED (light emitting diode) array 1, a light guide plate 51, a reflective sheet 52, a diffusion sheet 53, and lens sheets 54a and 54b.

The LED array 1 emits light as a light source, and the light guide plate 51 converts dot light (line light from the LED array 1) from the LEDs 2 of the LED array 1 into surface light. The reflective sheet 52 reflects the light from the LED array 1 and the light which has propagated through the inside of the light guide plate 51 toward the liquid crystal display panel without leakage.

The diffusion sheet 53 diffuses the light from the light guide plate 51 over the entire region of the liquid crystal display panel. The lens sheets 54 and 54b deflect (collect) the light before it enters the liquid crystal display panel so that brightness per unit area of the liquid crystal display panel increases.

Figure 1:
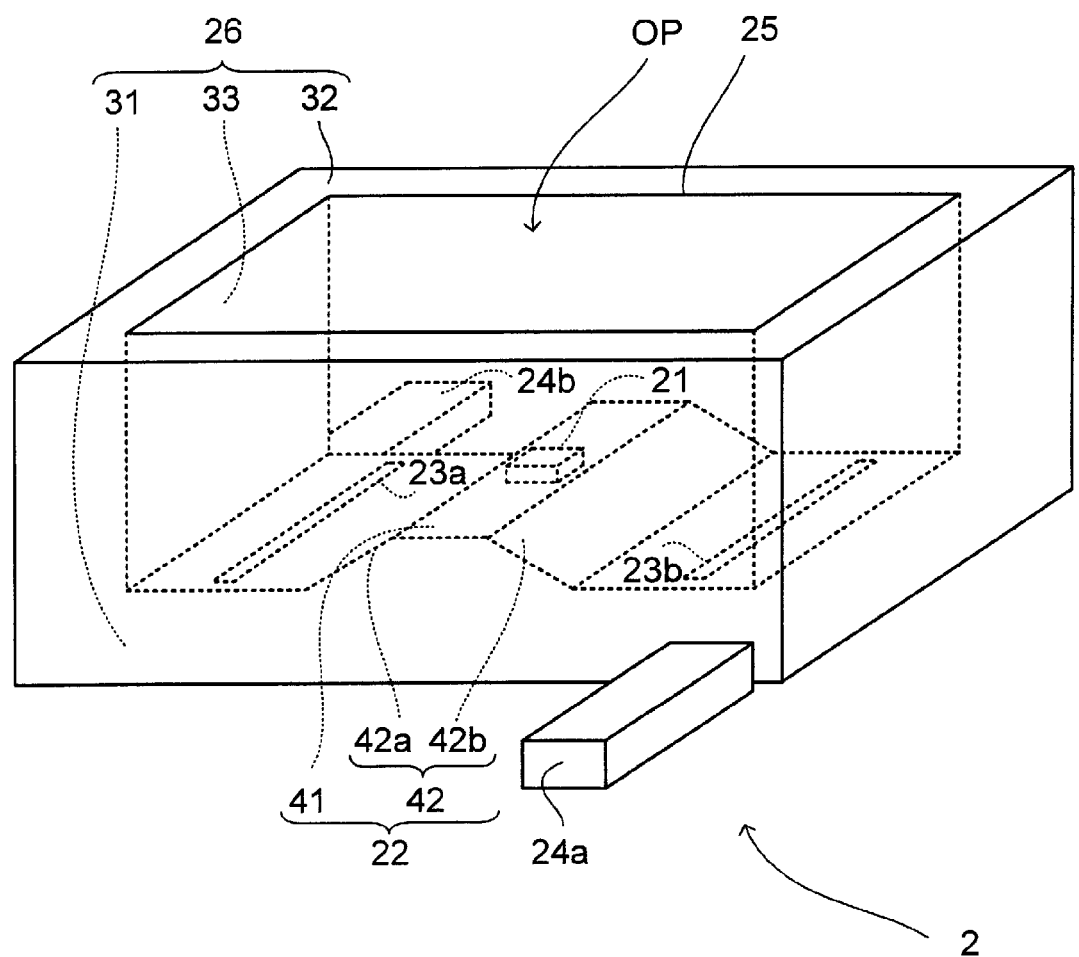
FIG. 1 is a perspective view of an LED according to a preferred embodiment of the present invention.
Figure 2A:
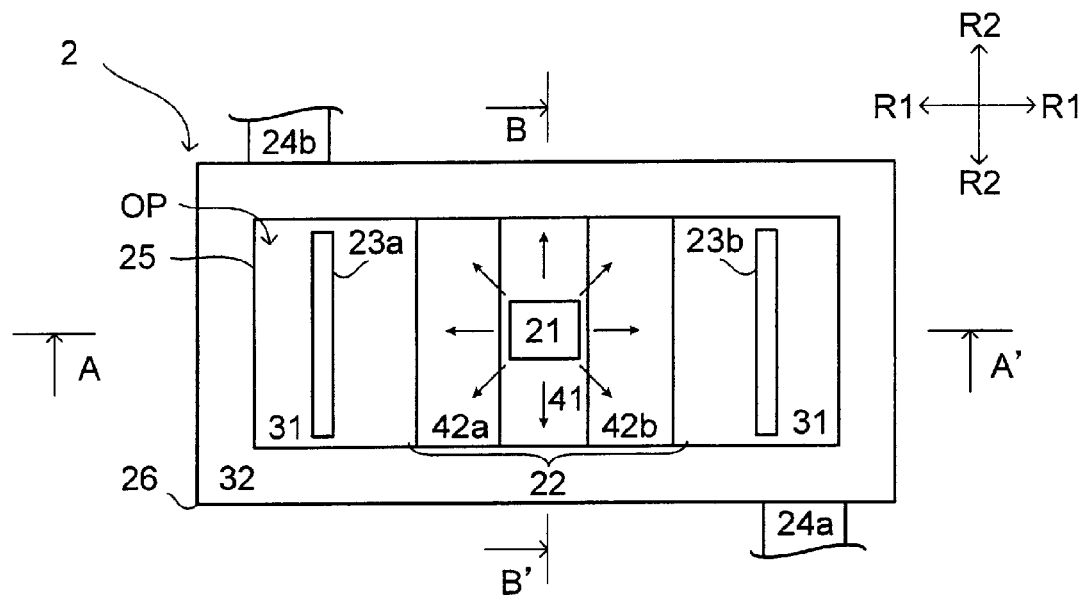
FIG. 2A is a plan view of the LED shown in FIG. 1.
Figure 2B:
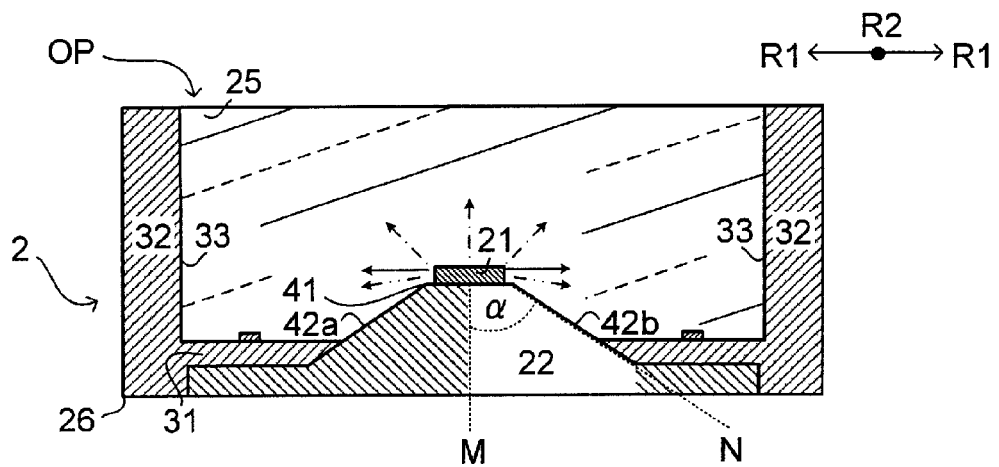
FIG. 2B is a sectional view taken along the A-A' line in FIG. 2A.
Figure 2C:
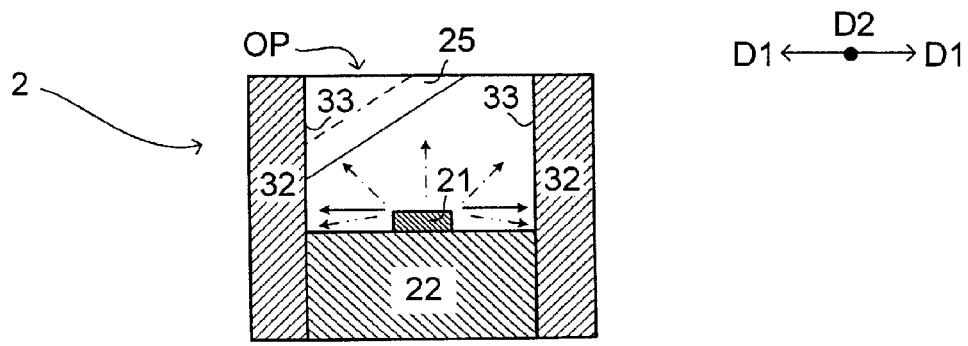
FIG. 2C is a sectional view taken along the B-B' line in FIG. 2A.
Figure 3:
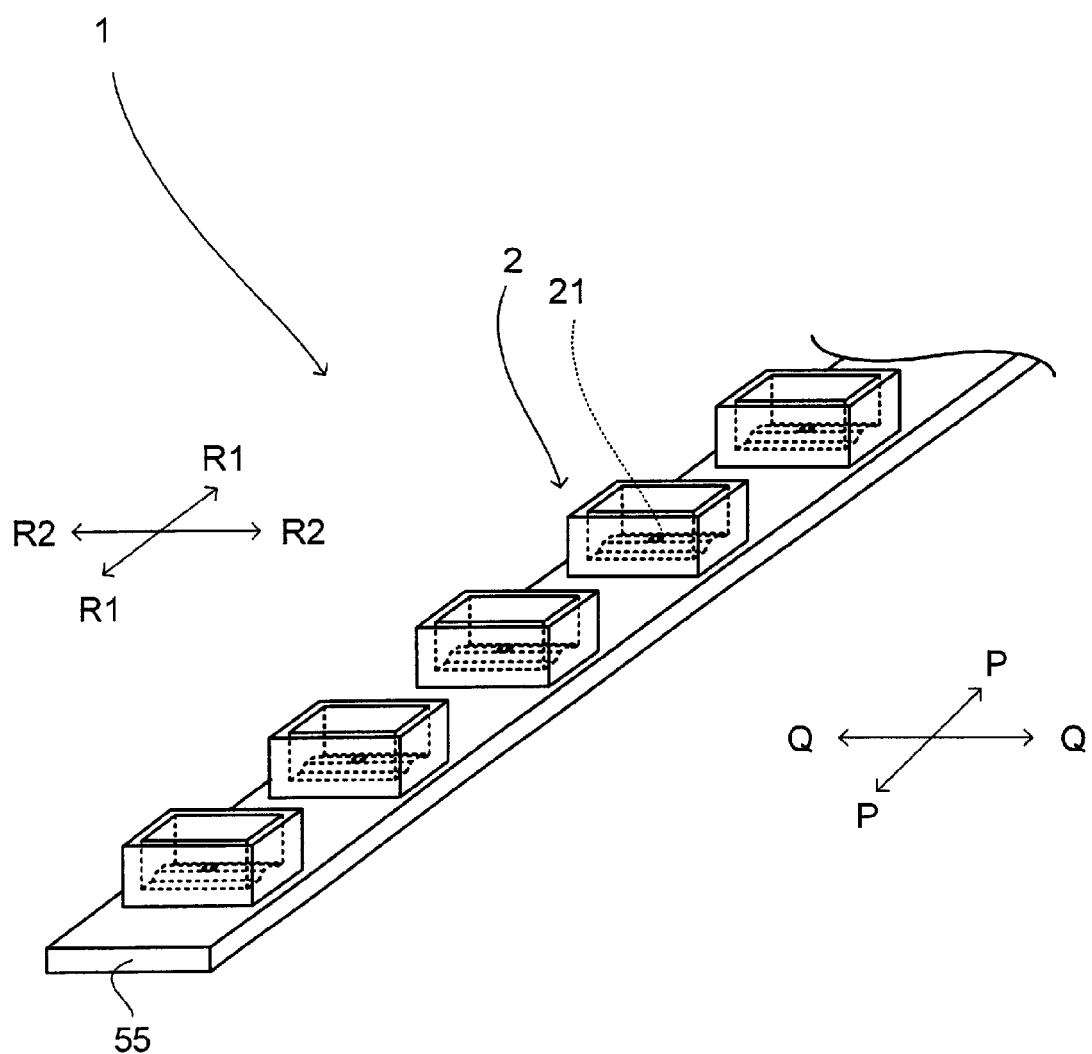
FIG. 3 is a perspective view of an LED array according to a preferred embodiment of the present invention.

Here, the LED array 1 and the LED 2 installed in the LED array 1 are described in detail using FIGS. 1, 2A to 2C, and 3. As shown in FIG. 3, the LED array 1 includes a base board 55, and a plurality of LEDs 2 arranged on the base board 55 in a line. A perspective view of the LED 2 is shown in FIG. 1, FIG. 2A is a plan view of the LED 2 shown in FIG. 1, FIG. 2B is a sectional view taken along the A-A' line in FIG. 2A, and FIG. 2C is a sectional view taken along the B-B' line in FIG. 2A. Arrows P shown in figures (e.g., FIG. 3) indicate an array direction P in which the LEDs 2 are arranged, and arrows Q indicate a direction perpendicular to the array direction P in a plane of the base board 55 (arrows R1 and R2 are described later).

As shown in FIGS. 1 and 2A to 2C, the LED 2 includes a light emitting chip 21, a slug (base portion) 22, a lead frame (including leads 23a, 23b), a terminal (including an anode 24a and a cathode 24b), a sealing member 25, and a package 26.

The light emitting chip 21 emits light spherically with respect to itself. For example, the light emitting chip 21 emits light in azimuth directions, that is, radially with respect to itself (see solid-line arrows in FIGS. 2A to 2C), and emits light radially in elevation angle directions and depression angle directions (see one-dot-one-bar line arrows and two-dot-one-bar line arrows in FIG. 2B).

The slug 22 not only supports the light emitting chip 21 but also radiates heat accumulated in the light emitting chip 21 (accordingly, the slug 22 can also be called a heat sink). It is desirable that a material of the slug 22 is a metal to secure heat radiation characteristics, though it is not limited to a metal. There are various shapes of the slug 22, which are described later in detail.

The lead frame (23a, 23b) and the terminal (anode 24a and cathode 24b) are paths arranged to permit an electric current to flow through the light emitting chip 21. Accordingly, it is desirable that both of the lead frame (23a, 23b) and the terminal (24a, 24b) are made of a metal having a high electroconductivity. The lead frame (23a, 23b) is disposed inside the package 26, while the terminal (24a, 24b) is disposed outside the package 26.

The sealing member 25 covers the light emitting chip 21. Because the sealing member 25 must transmit the light from the light element chip 21 there through, it is preferably made of a light-transmissive resin.

The package 26 houses the sealing member 25, the light emitting chip 21, the slug 22, and the lead frame (23a, 23b), and includes a plate-like bottom portion 31, and plate-like wall portions 32 which extend upright and sandwich the bottom portion 31 therebetween. In other words, the package 26 is a box whose ceiling portion is opened as an opening OP. The package 26 is formed of a resin or the like (e.g., heat-resistant polymer or polyphthalamide (PPA)) that has a reflective function. Accordingly, a portion of the emitted light from the light emitting chip 21 hits the wall portions 32, is reflected, and travels to the opening OP.

Here, the slug 22 is described in detail. As shown in FIG. 2B, the slug 22 is built in the bottom portion 31 of the package 26, and a portion of it is exposed from the bottom portion 31. The light emitting chip 21 is mounted on the top of the exposed portion. It is desirable that the slug 22 has a raised shape that includes a support surface 41 on which the light emitting chip 21 is mounted and which is arranged as the top, because according to this shape (e.g., a tapered shape), the number of times that a portion of the light emitted from the light emitting chip 21 hits the wall portions 32 can be reduced.

Figure 4A:
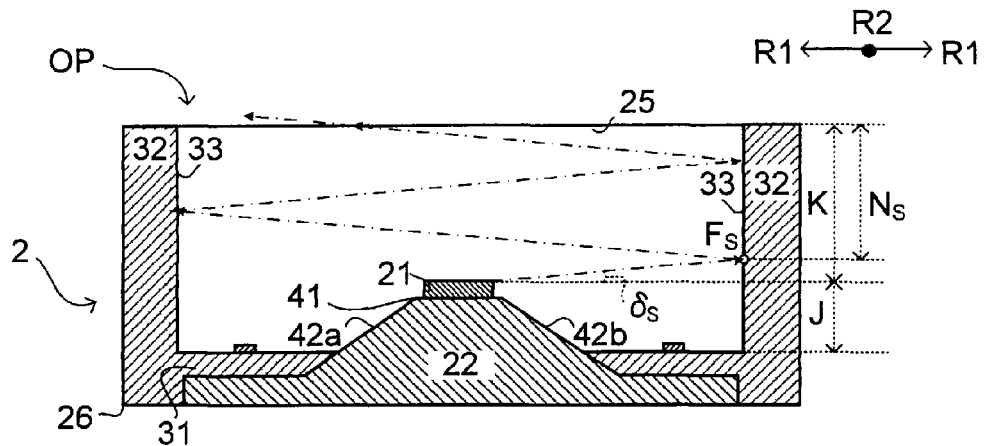
FIG. 4A is an optical path view of light from a light emitting chip according to a preferred embodiment of the present invention which extends in an elevation angle direction according.
Figure 4B:
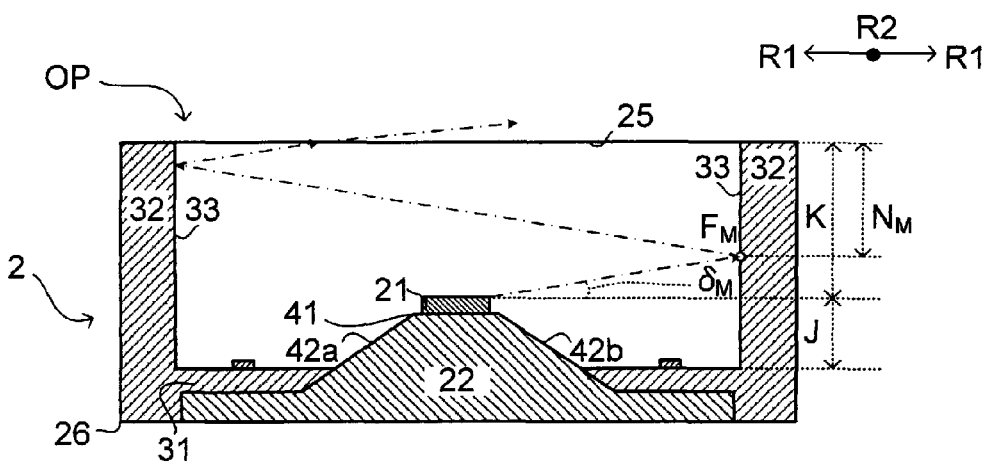
FIG. 4B is an optical path view of light from a light emitting chip according to a preferred embodiment of the present invention which extends in a direction of an elevation angle larger than that in FIG. 4A.
Figure 4C:
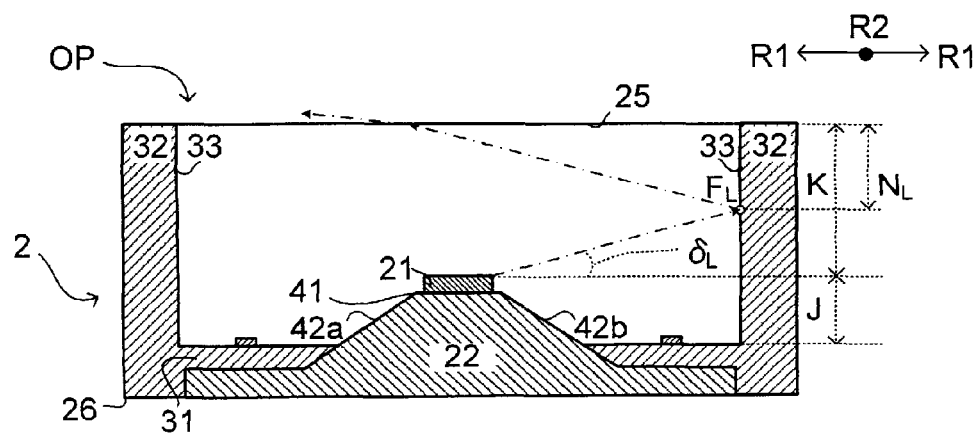
FIG. 4C is an optical path view of light from a light emitting chip according to a preferred embodiment of the present invention which extends in a direction of an elevation angle larger than that in FIG. 4B.
Figure 5A:
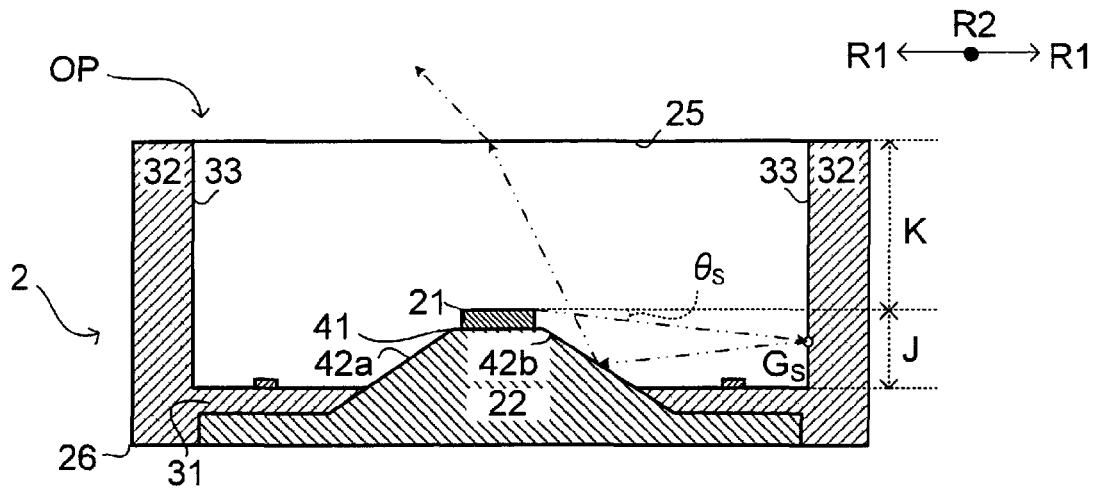
FIG. 5A is an optical path view of light from a light emitting chip according to a preferred embodiment of the present invention which extends in a depression angle direction.
Figure 5B:
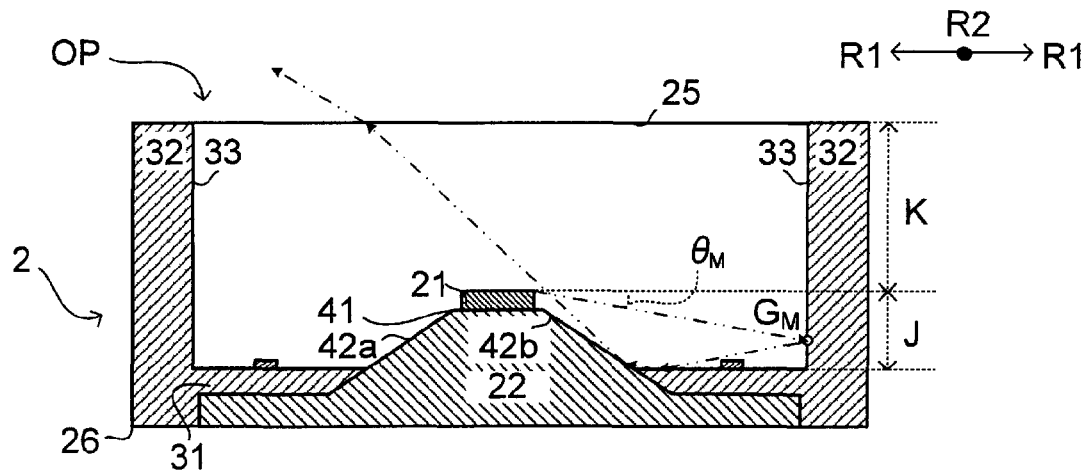
FIG. 5B is an optical path view of light from a light emitting chip according to a preferred embodiment of the present invention which extends in a direction of a depression angle larger than that in FIG. 5A.
Figure 5C:
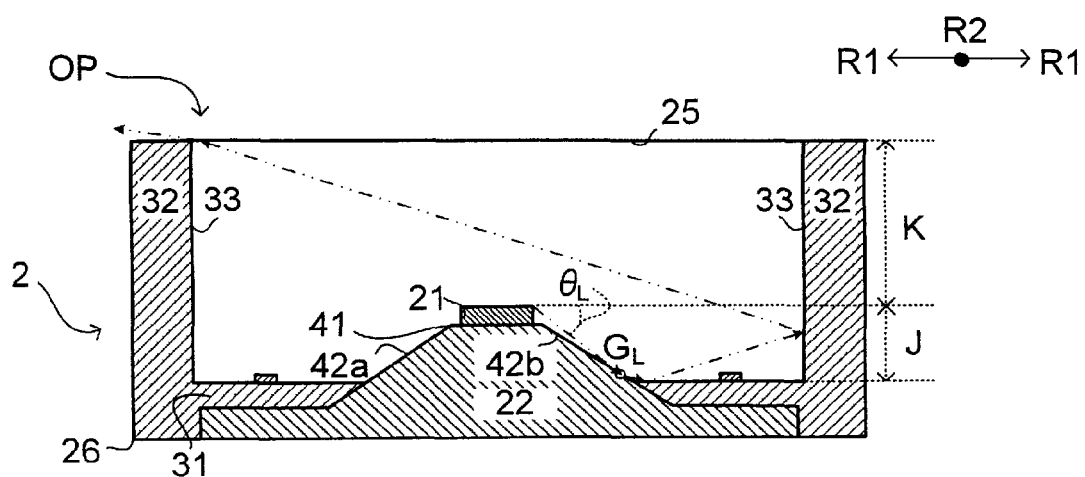
FIG. 5C is an optical path view of light from a light emitting chip according to a preferred embodiment of the present invention which extends in a direction of a depression angle larger than that in FIG. 5B.

The reason for this is explained with reference to FIGS. 4A-4C, and 5A-5C which are seen from the same sectional direction as that of FIG. 2B. FIGS. 4A-4C show examples of light that travels in elevation angle directions with respect to the light emitting chip 21, and the elevation angle δ becomes larger in the order of FIGS. 4A to 4C ($\delta_S < \delta_M < \delta_L$). On the other hand, FIGS. 5A-5C show examples of light that travels in depression angle directions with respect to the light emitting chip 21, and the depression angle θ becomes larger in the order of FIGS. 5A to 5C ($\theta_S < \theta_M < \theta_L$).

As shown in FIGS. 4A-4C and 5A-5C, the light emitting chip 21 is spaced away from the bottom portion 31 of the package 26 by the height (distance J) of the slug 22, that is, the light emitting chip 21 comes to the opening OP of the package 26 the closer. Accordingly, the length (distance K) from the light emitting chip 21 to the opening OP becomes comparatively short.

As shown in FIGS. 4A-4C, because the emitted light from the light emitting chip 21 travels in elevation angle directions, the emitted light hits the wall portions 32 corresponding to the distance K and is reflected. The reflected light travels toward the opening OP with the reflection angle δ. If there is the wall portion 32 ahead of the reflected light, the light hits the wall portion 32 and is reflected. If there is still the wall portion 32 ahead of the reflected light, the light hits the wall portion 32 and is reflected. The light repeats the behavior of hitting and reflecting off the wall portions 32 corresponding to the distance K until the light reaches the opening OP.

However, as shown in FIGS. 4A-4C, the wall portions 32 corresponding to the distance K are shorter than the total length (distance K+distance J) of the wall portions 32. Accordingly, the number of times that the light hits and reflects off the wall portions 32 corresponding to the distance K until the light reaches the opening OP is smaller than that, for example, in a case where the light which is emitted from the light emitting chip located on the bottom portion travels in an elevation angle direction, and repeats the behavior of hitting and reflecting off the wall portions until it reaches the opening OP.

In other words, because the light emitting chip 21 is mounted on the top (support surface 41) of the tapered slug 22 which protrudes from the bottom portion 31 of the package 26, the distance K between the light emitting chip 21 and the opening OP of the package 26 becomes short. And because of this (that is, the shorter the distance K is), the smaller the number of times that the light repeats the behavior of hitting and reflecting off the wall portions 32 corresponding to the distance K becomes.

As shown in FIGS. 4A-4C, the larger the elevation angle δ is, the closer the first arrival point F ($F_S$, $F_M$, and $F_L$; see white dots), where the emitted light from the light emitting chip 21 reaches the wall portion 32 for the first time, comes to the opening OP. Therefore, the length (the distance N; the length N ($N_S$, $N_M$, and $N_L$) from the arrival point F to the opening OP) of the wall portions 32 where the light (the reflected light) from the arrival point F hits next becomes short. Accordingly, the number of times that the light repeats the behavior of hitting and reflecting off the wall portions 32 after the arrival point F becomes small depending on the distance N (in other words, the larger the elevation angle δ is, the shorter the distance N is, thereby the number of hits and reflections of the light decreases).

On the other hand, as shown in FIGS. 5A-5C, because the light from the light emitting chip 21 advances in depression angle directions, first the emitted light reaches the wall portion 32 or a side surface (outer side surface) 42 of the slug 22 (the point where the light reaches is called an arrival point G ($G_S$, $G_M$, and $G_L$); see white dots).

As shown in FIG. 5A, because the emitted light traveling with a comparatively small depression angle $\theta_S$ hits the wall portion 32, the arrival point $G_S$ where the emitted light reaches the wall portion 32 is slightly lower than the support surface 41 of the slug 22 (in other words, the smaller the depression angle $\theta_S$ is, the higher the arrival point $G_S$ is in the distance direction J (the height direction J)).

The light reflected at the arrival point $G_S$ travels toward the center (that is, the light emitting chip 21) of the package 26 with a comparatively small reflection angle $\theta_S$. Specifically, the reflected light does not travel to the bottom portion 31 located below the arrival point $G_S$, but advances in a lateral direction (a horizontal direction) from the arrival point $G_S$, and reaches the side surface 42 (42b) of the slug 22. The slug 22 where the light reaches is tapered, and the foot portion of the side surface 42 is close to the wall portions 32 of the package 26. Therefore, the side surface 42 of the slug 22 is inclined looking up at the opening OP.

Accordingly, the incident light to the side surface 42 of the slug 22 made of metal or the like reflects off the side surface 42 and travels toward the opening OP. In some cases, the reflected light from the side surface 42 of the slug 22 sometimes directly reaches the opening OP without hitting the wall portions 32. Therefore, the light can hit and reflect off the wall portion 32 only once, that is, at the arrival point $G_S$.

As shown in FIG. 5B, in a case where the emitted light from the light emitting chip 21 traveling with a depression angle $\theta_M$ reaches the wall portion 32, because the depression angle $\theta_M$ is larger than the depression angle $\theta_S$, the arrival point $G_M$ where the emitted light reaches the wall portion 32 is close to the bottom portion 31 of the package 26 (in other words, the arrival point $G_M$ is located at a comparatively low position in the height direction J).

The reflected light from the arrival point $G_M$ travels toward the center of the package 26 with the reflection angle $\theta_M$. However, because the reflection angle $\theta_M$ is larger than the reflection angle $\theta_S$, and because the arrival point $G_M$ is lower than the arrival point $G_S$, the reflected light does not directly reach the side surface 42 of the slug 22 located in the lateral direction from the arrival point $G_M$, but travels to the bottom portion 31 located below the arrival point $G_M$.

Because the light traveling toward the bottom portion 31 travels toward the center of the package 26 from the arrival point $G_M$ close to the bottom portion 31, it hits the bottom portion 31 with a comparatively large incident angle. Therefore, the reflected light from the bottom portion 31 also has a comparatively large reflection angle. Accordingly, the reflected light from the bottom portion 31 travels for the center of the package 26 substantially along the surface direction of the bottom portion 31, and hits the side surface 42 (42b) of the slug 22.

If the light hits the side surface 42 of the slug 22 made of metal or the like in this way, the reflected light from the surface 42 sometimes directly reaches the opening OP without hitting the wall portions 32. In such cases, the light can hit and reflect off the wall portion 32 only once, that is, at the arrival point $G_M$.

As shown in FIG. 5C, the emitted light from the light emitting chip 21 traveling with a comparatively large depression angle $\theta_L$ hits the side surface 42 (42b) of the slug 22 without directly hitting the wall portions 32. Because this side surface 42 is not only located at a position closer to the bottom portion 31 rather than the support surface 41 but also inclined looking up at the opening OP. Therefore, the emitted light hits the side surface 42 with a comparatively large incident angle. Accordingly, the reflected light from the arrival point $G_L$ where the emitted light reaches the surface 42 (42b) hits the bottom portion 31 of the package 26 located at the foot portion of the side surface 42 with a comparatively large reflection angle.

The light hitting the bottom portion 31 reflects off there, advances, hits the wall portion 32, then reflects off there. This reflected light sometimes directly reaches the opening OP. In such cases, the light can hit and reflect off the wall portion 32 only once after it hits and reflects off the bottom portion 31.

In more detail, because the side surface 42 of the slug 22 defines an optical action surface 42 that receives a portion of the light from the light emitting chip 21 and reflects it (the reference number 42 is sometimes used to indicate the optical action surface for convenience), the light from the light emitting chip 21 traveling between the wall portions 32 is reflected by the side surface 42 of the slug 22, and is sometimes guided directly to the opening OP. In such cases, the number of times that the light repeats the behavior of hitting and reflecting off the wall portions 32 decreases.

As seen from the optical path views shown in FIGS. 4A-4C and 5A-5C, in the raised-shape slug 22 having the support surface 41 as the top, because the side surface 42 is an optical action surface 42 that receives a portion of the light from the light emitting chip 21 and reflects it, chances that the light traveling in elevation angle directions and the light traveling in depression angle directions reach the wall portions 32 of the package 26 decrease. Therefore, the light deterioration of the wall portions 32 can be prevented and minimized. Accordingly, degradation of the reflectance of the wall portions 32 due to the light deterioration does not occur, and the amount of incident light traveling into the light guide plate 51 becomes stable.

Especially in the case where the slug 22 protrudes from the bottom portion 31 of the package 26 toward the opening OP and is tapered with the support surface 41 formed as the top, because the light emitting chip 21 disposed on the support surface 41 is close to the opening OP, the light traveling in elevation angle directions easily reaches the opening OP. On the other hand, because the side surface 42 is inclined looking up at the opening OP, the light traveling in depression angle directions easily reaches the opening OP.

The optical action surface 42 may be a curved surface (free curved surface or the like) or a flat surface. Besides, the optical action surface 42 may be a mirror surface or a rough surface. In short, the optical action surface 42 may be any surface shape as long as it can reflect light.

The optical action surface 42 has a preferable angle range. As shown in FIG. 2B, assuming that a perpendicular or substantially perpendicular line M is drawn from the light emitting chip 21 to the bottom of the slug 22, the angle range is defined on a sectional plane including the perpendicular or substantially perpendicular line M by the following conditional expression A. Although there are many sectional planes including the perpendicular or substantially perpendicular line M besides that shown in FIG. 2B, all that is needed is only one which meets the conditional expression A.

$$5° \leq \alpha \leq 85° \quad \text{conditional expression A}$$

where, $\alpha$: an angle between the line N that indicates the optical action surface 42 (side surface 42) and the perpendicular or substantially perpendicular line M that extends from the light emitting chip 21 to the bottom of the slug 22 (in FIG. 2B, the line N is slightly deviated from the side surface 42 of the slug 22 for convenience).

If $\alpha$ falls outside the angle range defined by the conditional expression A, for example, if $\alpha$ becomes lower than the lower limit value, the side surface 42 of the slug 22 is inclined so as to come close to the perpendicular or substantially perpendicular line M. Accordingly, the wall portion 32 (especially the inner wall surface 33 of the wall portion 32) of the package 26 substantially parallel to the perpendicular or substantially perpendicular line M opposes the side surface 42 of the slug 22 (that is, they oppose each other substantially in parallel).

As described above, for example, the light that is emitted from the light emitting chip 21 and travels with a comparatively small depression angle $\theta_S$ often travels back between the surfaces (the side surface 42 and the inner wall surface 33), and it is hard for the light to travel to the opening OP of the package 26. Accordingly, chances that the light reaches the wall portions 32 of the package 26 increase so as to deteriorate the wall portions 32.

On the other hand, if $\alpha$ exceeds an upper limit value, the side surface 42 of the slug 22 is inclined so as to come close to the direction perpendicular or substantially perpendicular to the perpendicular or substantially perpendicular line M. Accordingly, the wall portion 32 (especially the inner wall surface 33 of the wall portion 32) of the package 26 substantially parallel to the perpendicular or substantially perpendicular line M does not oppose the side surface 42 of the slug 22 (that is, the surfaces become substantially perpendicular to each other).

As described above, for example, the light that is emitted from the light emitting chip 21 and travels with a comparatively small depression angle $\theta_S$ does not hit the side surface 42 of the slug 22 after it reflects off one wall portion 32, but often hits the other wall portion 32 (e.g., the wall portion 32 opposite to the wall portion 32 which the light hits first). Therefore, it is hard for the light to travel to the opening OP of the package 26. Accordingly, chances that the light reaches the wall portions 32 of the package 26 increase so as to deteriorate the wall portions 32.

As seen for the foregoing description, if $\alpha$ is set to fall in the range defined by the conditional expression A, chances that the light reaches the wall portions 32 decrease. In other words, chances that the light directly travels to the opening OP of the package 26 after it hits the side surface 42 of the slug 22 increase. Accordingly, light deterioration of the wall portions 32 only slightly occur.

As shown in FIG. 1, in a case where the side surfaces 42a, 42b of the slug 22 are arranged to oppose each other with respect to the light emitting chip 21, a direction (first direction R1) in which the side surfaces 42a and 42b are arranged is defined. Besides, another direction that is perpendicular to the first direction R1 and to the direction in which the slug 22 extends (the protrusion direction in which the slug 22 protrudes from the bottom portion 31 of the package 26) is defined as a second direction R2.

Figure 6:
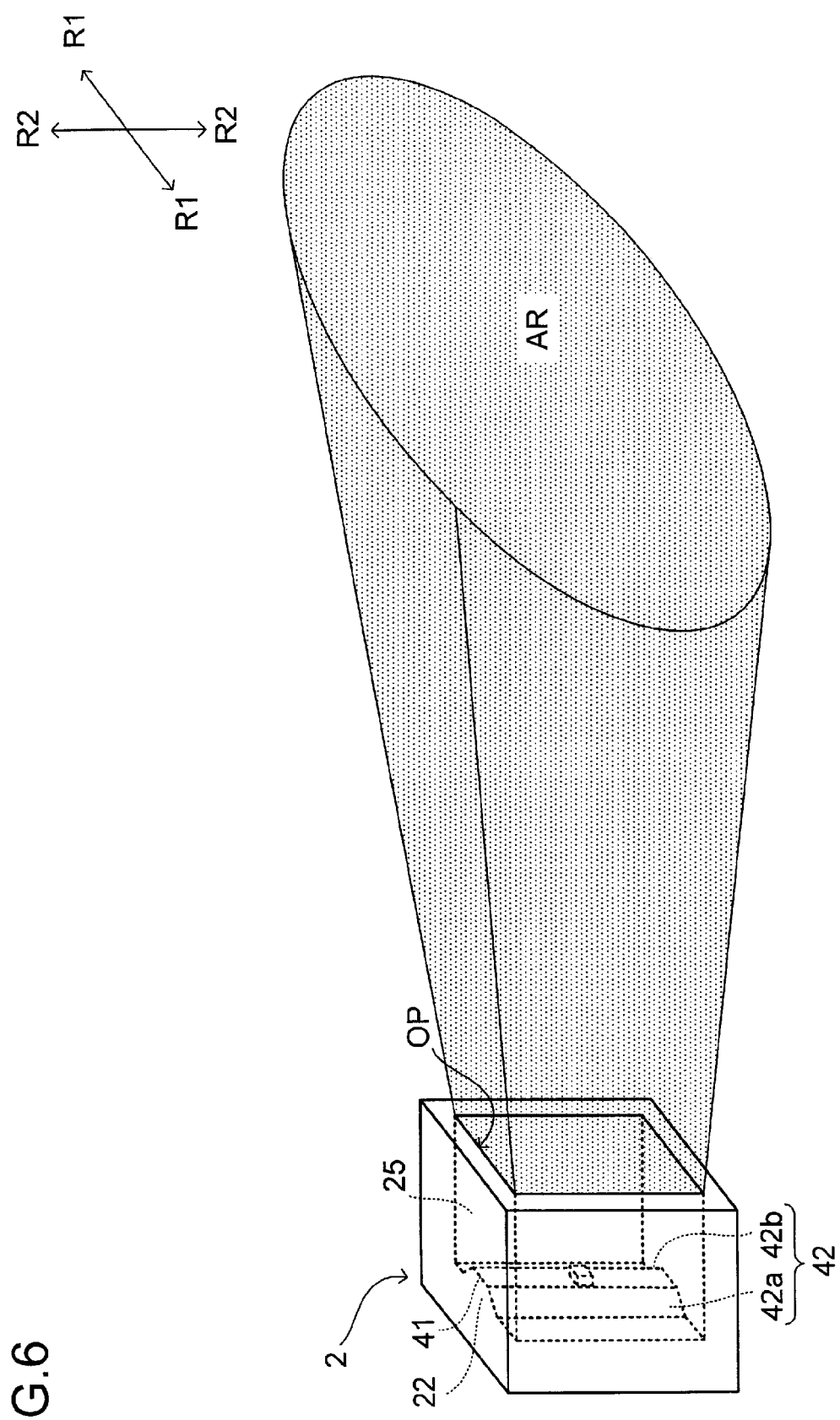
FIG. 6 is a perspective view showing light emitted from an LED according to a preferred embodiment of the present invention.
Figure 8A:
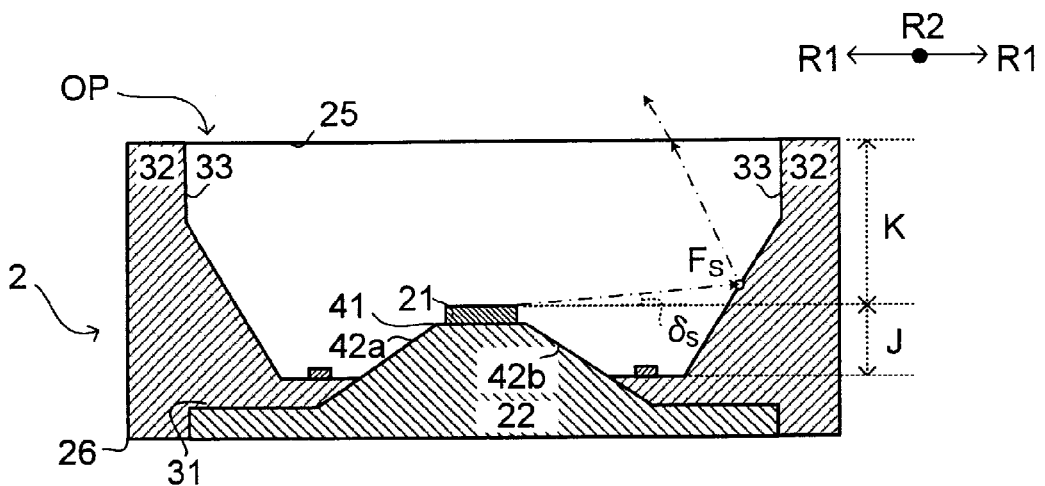
FIG. 8A is a view showing an optical path in a modification of the element according to a preferred embodiment of the present invention illustrated in FIG. 4A.
Figure 8B:
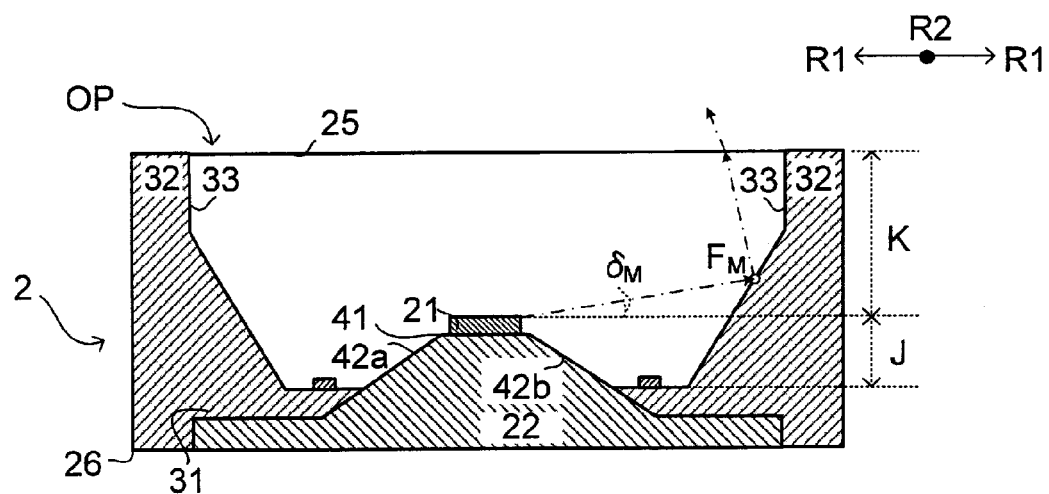
FIG. 8B is a view showing an optical path in a modification of the element according to a preferred embodiment of the present invention illustrated in FIG. 4B.
Figure 8C:
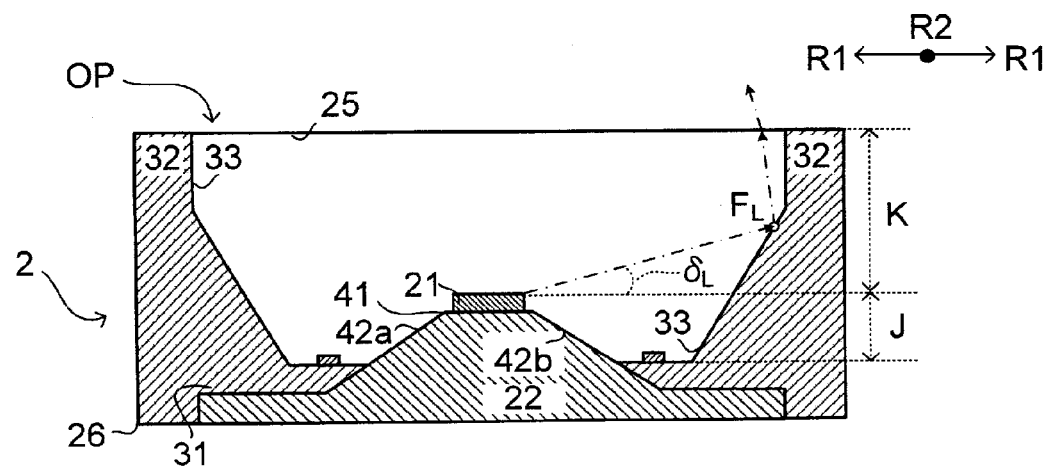
FIG. 8C is a view showing an optical path in a modification of the element according to a preferred embodiment of the present invention illustrated in FIG. 4C.
Figure 9A:
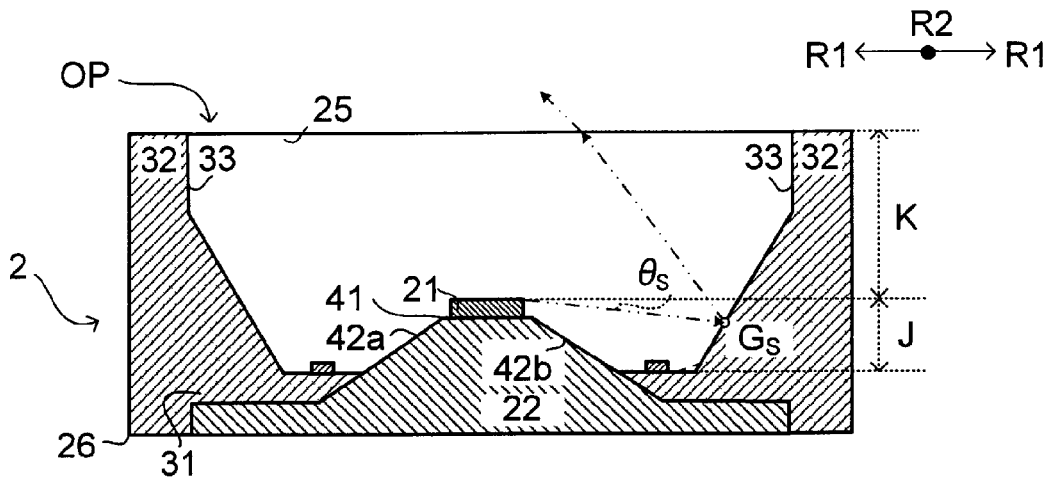
FIG. 9A is a view showing an optical path in a modification of the element according to a preferred embodiment of the present invention illustrated in FIG. 5A.
Figure 9B:
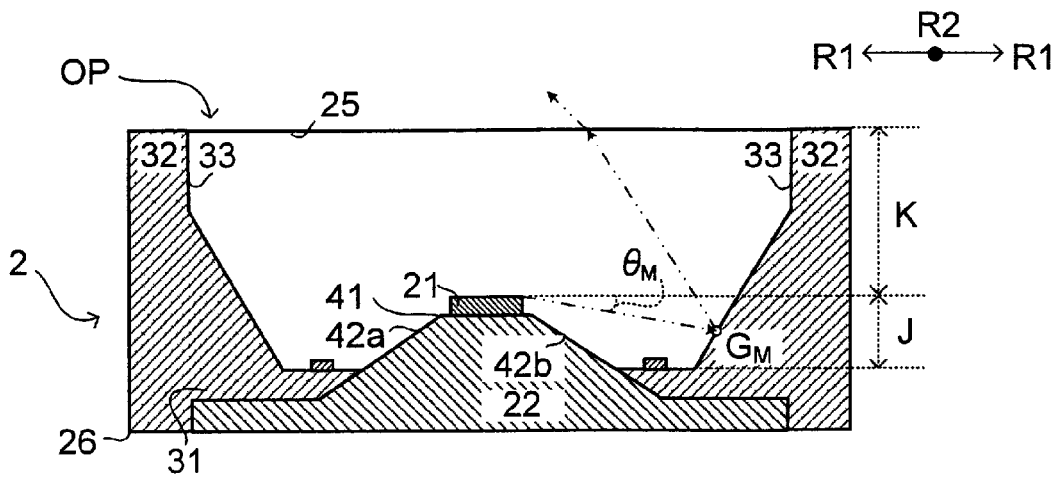
FIG. 9B is a view showing an optical path in a modification of the element according to a preferred embodiment of the present invention illustrated in FIG. 5B.
Figure 9C:
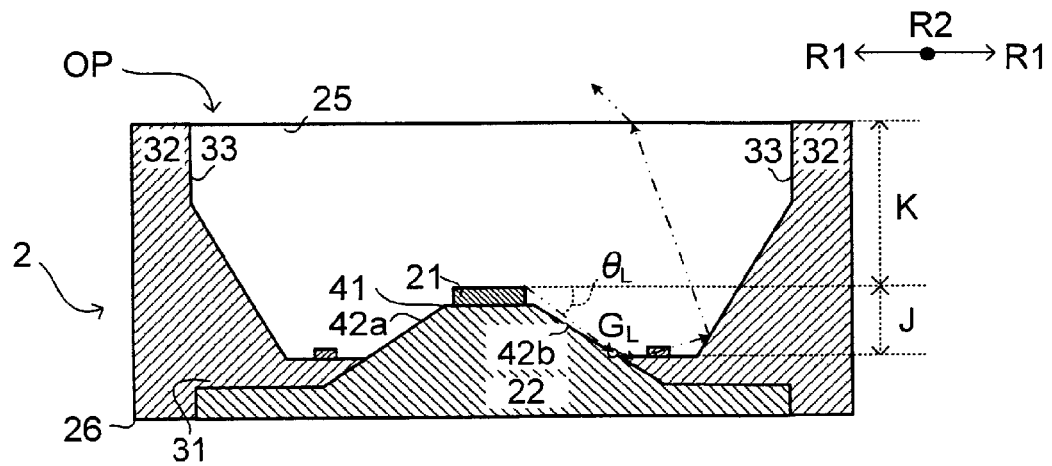
FIG. 9C is a view showing an optical path in a modification of the element according to a preferred embodiment of the present invention illustrated in FIG. 5C.

As described above, the side surfaces 42a, 42b of the slug 22 are arranged in the first direction R1, but they are not arranged in the second direction R2. Therefore, as shown in FIG. 6, the light that hits the side surfaces 42a, 42b of the slug 22 easily spread in the first direction R1, while it is hard for the light to spread in the second direction R2.

Accordingly, a radiation area AR generated by the emitted light from the LED 2 is long in the first direction R1 and short in the second direction R2. This means that the LED 2 emits light which spreads in a desired direction as a whole.

As shown in FIG. 7 (sectional view taken along the C-C' line in FIG. 15), in a case where the LEDs 2 are arranged in the longitudinal direction of a side end of the light guide plate 51, it is desirable that the longitudinal direction and the first direction R1 extend in the same direction, because the light spreads along the longitudinal direction of the side end of the light guide plate 51 as a whole.

In addition, it is desirable that the different optical action surfaces 42 of the adjoining LEDs 2 of the LED array 1 oppose each other and are arranged in a line. In other words, it is desirable that the direction (array direction P) in which the LEDs 2 are arranged and the direction (first direction R1) in which the optical action surfaces 42 are arranged agree with each other.

As described above, a plurality of the optical action surfaces 42 are arranged in the first direction R1, the light from each of the LEDs 2 spreads in the first direction and overlaps with each other. Accordingly, in the case where the first direction R1 and the longitudinal direction of the side end of the light guide plate 51 agree with each other, the light spreads over substantially the entire region in the longitudinal direction.

The side surfaces 42 are suitably inclined, which is another reason for the light that reflects off the side surfaces 42 of the slug 22 advances to spread in the first direction R1. Therefore, it is desirable that the section including the perpendicular or substantially perpendicular line M for the conditional expression A that represents an inclination of the side surfaces 42 is the section taken along the first direction R1.

Second Preferred Embodiment

A second preferred embodiment will now be explained. Members whose functions are the same as those of members used in the first preferred embodiment are indicated by the same reference numbers and the explanations are skipped. In this preferred embodiment, the wall portions 32 of the package 26 and the lead frame 23 are described in detail.

In the first preferred embodiment, as shown in FIG. 1, it has been explained that the wall portions 32 are perpendicular or substantially perpendicular to one surface of the bottom portion 31 of the package 26. However, this is not limiting. For example, a portion of the inner-wall surface 33 of the wall portion 32 of the package 26 may be arranged into a tilted surface 33 inclined looking up at the opening OP (the reference number 33 is sometimes used to indicate the tilted surface for convenience).

As describe above and as shown in FIGS. 8A-8C and 9A-9C, both the light from the light emitting chip 21 which travels in the elevation angle (δ) direction and the light from the light emitting chip 21 which travels in the depression angle (θ) direction are reflected by the tilted surface 33 in an upward direction, and easily reach the opening OP of the package 26. Accordingly, the number of times that the light repeats the behavior of hitting and reflecting off the wall portions 32 of the package 26 further decreases.

Figure 10:
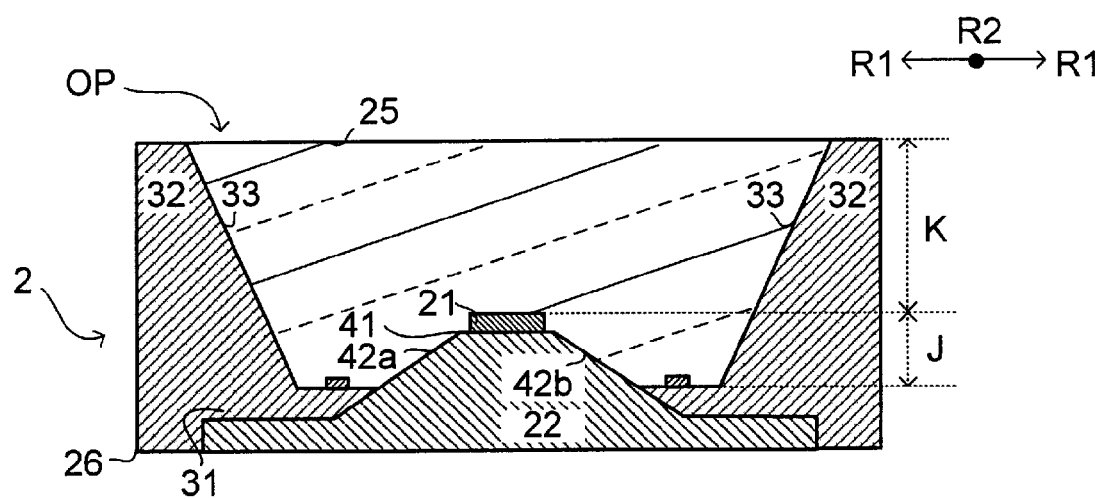
FIG. 10 is a sectional view of an LED according to a preferred embodiment of the present invention in which the entire inner-wall surface of a wall portion of a package is inclined.

A portion of the inner-wall surface 33 of the wall portion 32 of the package 26 is provided with a tilted surface 33 inclined looking up at the opening in the foregoing description. However, as shown in FIG. 10, the entire inner-wall surface 33 of the wall portion 32 of the package 26 may be provided with a tilted surface 33 inclined to look up at the opening OP. In short, at least a portion of the inner-wall surface 33 of the wall portion 32 of the package 26 needs to be a tilted surface inclined looking up at the opening OP.

Figure 11A:
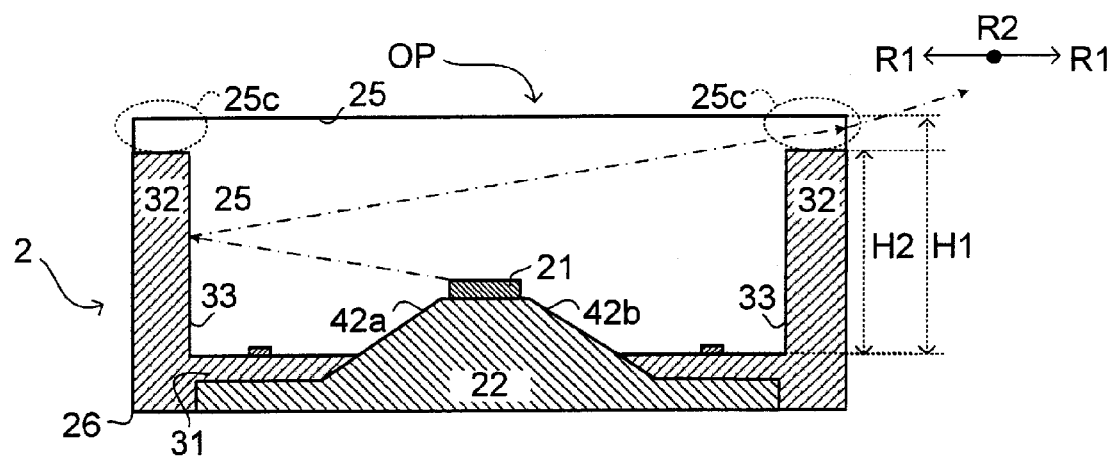
FIG. 11A is a sectional view showing another example of a sealing member of the LED according to a preferred embodiment of the present invention illustrated in FIG. 2B.
Figure 11B:
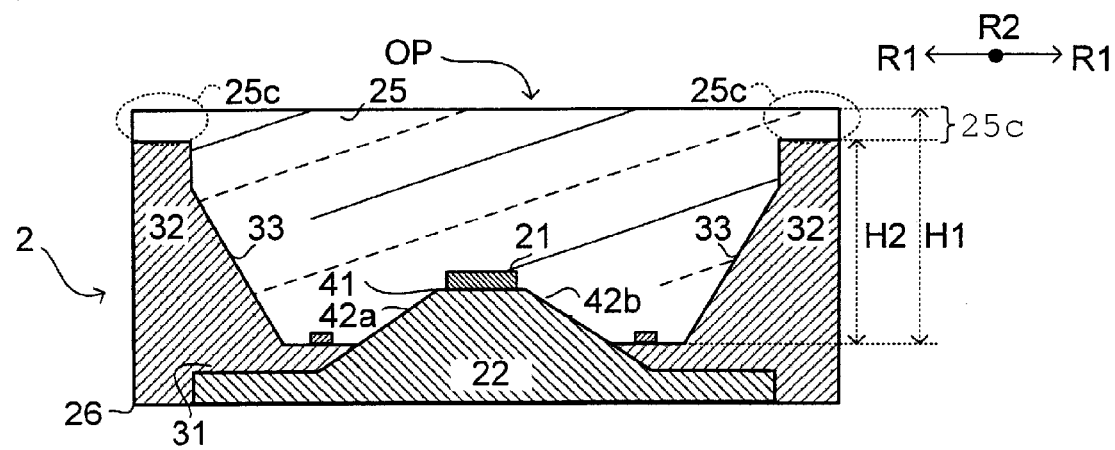
FIG. 11B is a sectional view showing another example of the LED according to a preferred embodiment of the present invention illustrated in FIG. 11A.

As shown in FIG. 7, to make the light from the LEDs 2 spread over the entire region in the longitudinal direction of the side end of the light guide plate 51, it is desirable that the length of the wall portion 32 of the package 26 which impedes the passage of light is made as short as possible. For example, as shown in FIGS. 11A and 11B, it is desirable that the height H1 of the sealing member 25 from the bottom portion 31 (the bottom surface in detail) of the package 26 and the height H2 of the wall portion 32 of the package 26 meet the following condition:

$$H1 \geq H2 \qquad \text{conditional expression B}$$

As described above, the light travels outside through a portion (a raised portion 25c described later) of the sealing member 25 corresponding to the difference between the height H1 of the sealing member 25 and the height H2 of the wall portion 32 of the package 26. This emitted light is not light which rises up sharply from the wall portion 32 and advances to the opening OP (that is, light having a small incident angle to the opening OP (the open surface in detail)), but for example, as shown in FIG. 11A, it is light which rises up slowly form the wall portion 32 and advances for the opening OP (that is, light having a large incident angle to the opening OP). Accordingly, this emitted light travels from the LED 2 in a lateral direction (that is, the light from the LED 2 extends widely).

As described above, to make the light from the LEDs 2 spread over the entire region in the longitudinal direction of the side end of the light guide plate 51, it is desirable to use the LED 2 which allows the light to spread widely. Such an LED 2 is completed by filling the package 26 with, for example, a resin used for the sealing member 25 in such a manner that the resin volume exceeds the accommodation volume of the package 26. Specifically, a portion of the resin for the sealing member 25 overflows the package 26, covers the top portions of the wall portions 32 leading to the opening OP, thereby the LED 2 is completed (the portion of the sealing member 25 to cover the top portions of the wall portions 32 is referred to as the raised portion 25c).

In other words, in the LED 2 which meets the conditional expression B, it can be considered that the upper ends of the wall portions 32, which lead to the opening OP, of the of the package 26 are cut away. Accordingly, light that would be blocked by the upper ends of the wall portions 32 travels to the outside without being reflected by the upper ends.

Figure 12A:
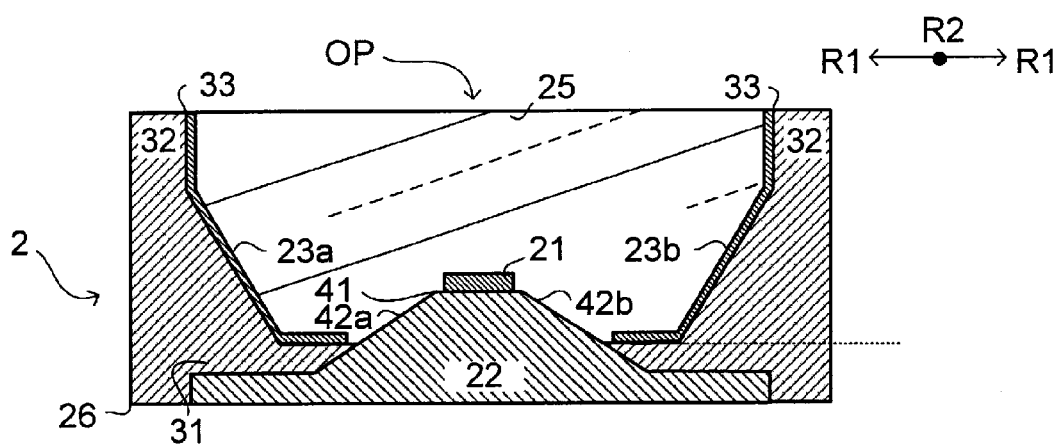
FIG. 12A is a sectional view of an LED according to a preferred embodiment of the present invention in which a lead frame is disposed on an inner wall of a wall portion and on a bottom portion of a package.
Figure 12B:
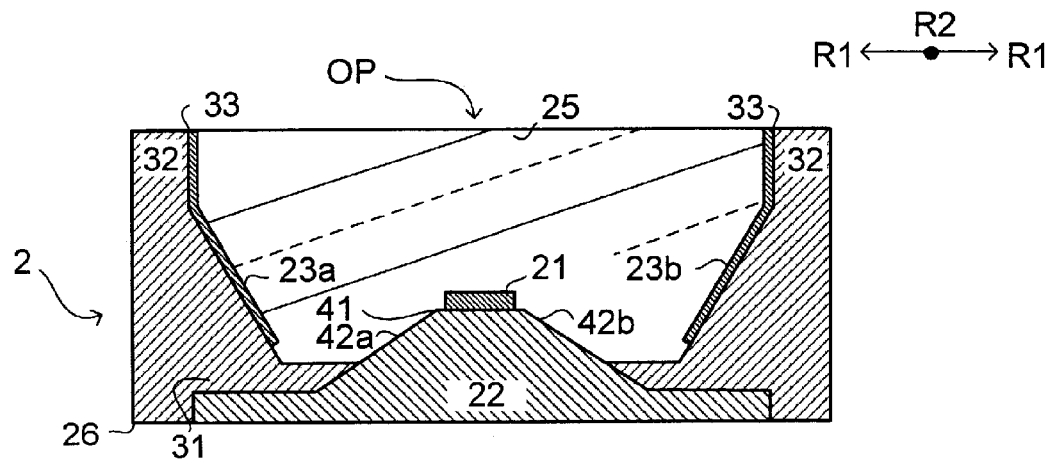
FIG. 12B is a sectional view showing still another example of the LED according to a preferred embodiment of the present invention illustrated in FIG. 11A.

As for the first preferred embodiment, it has been explained that the lead frame 23 which serves as a path for an electric current flowing through the light emitting chip 21 is disposed on the bottom portion 31 of the package 26. However, this is not limiting. For example, as shown in FIG. 12A, the lead frame (23a and 23b) may be disposed on the bottom portion 31 and the tilted surface 33 of the package 26, or as shown in FIG. 12B, it may be disposed on only the tilted surface 33 of the package 26.

In short, the lead frame (23a and 23b) needs only to be disposed on at least one of the bottom surface 31 and the tilted surface (23a and 23b) of the package 26. As described above, the light traveling inside the package 26 sometimes hits the lead frame (23a and 23b). In such cases, the light cannot reach the resin portion of the package 26 covered by the lead frame 23, thereby the light deterioration of the package 26 hardly occur.

Other Preferred Embodiments

The present invention is not limited to the preferred embodiments explained above, and various modifications can be made without departing from the spirit of the present invention.

Figure 13:
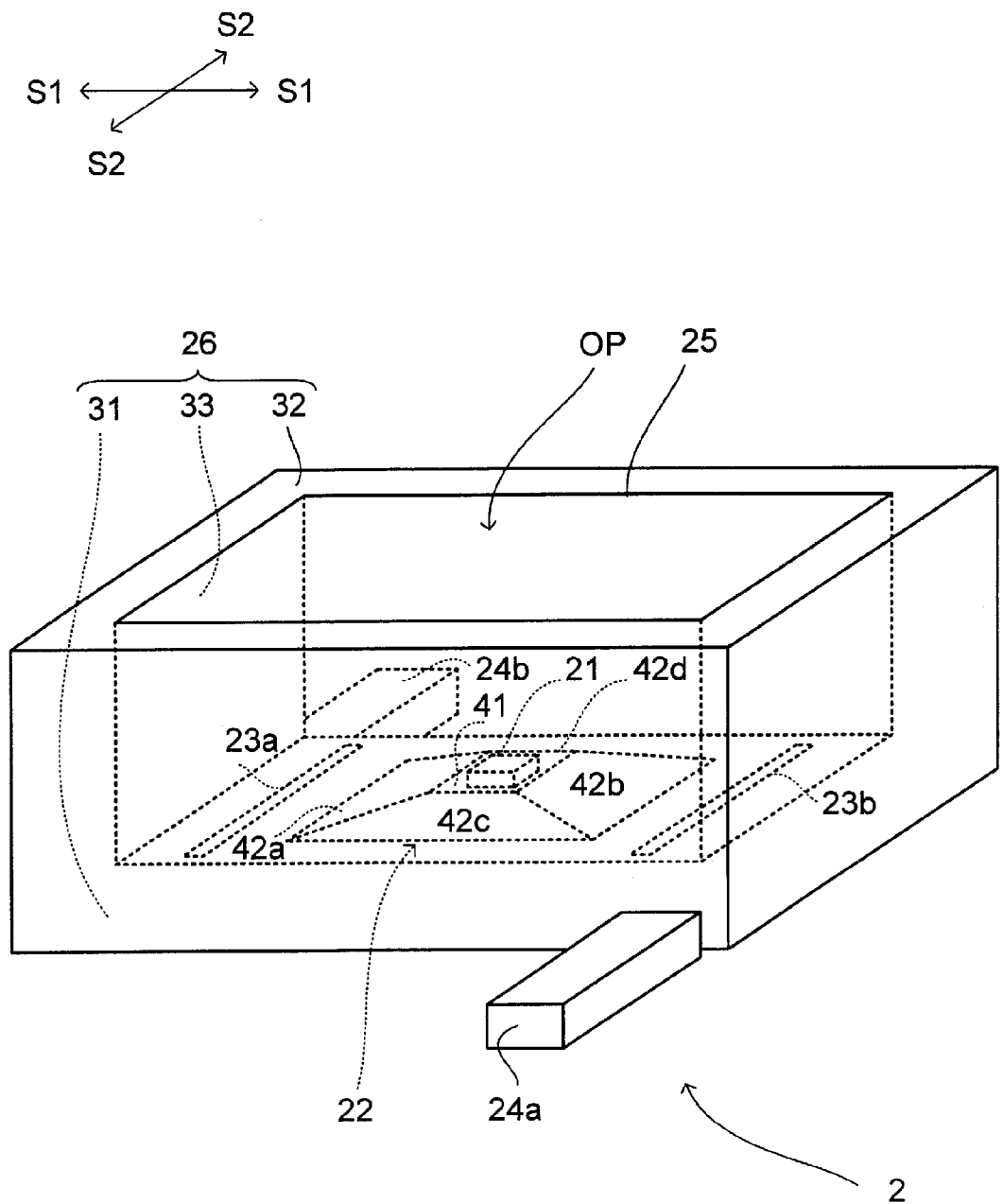
FIG. 13 is a perspective view showing a modification of the LED according to a preferred embodiment of the present invention illustrated in FIG. 1.
Figure 14:
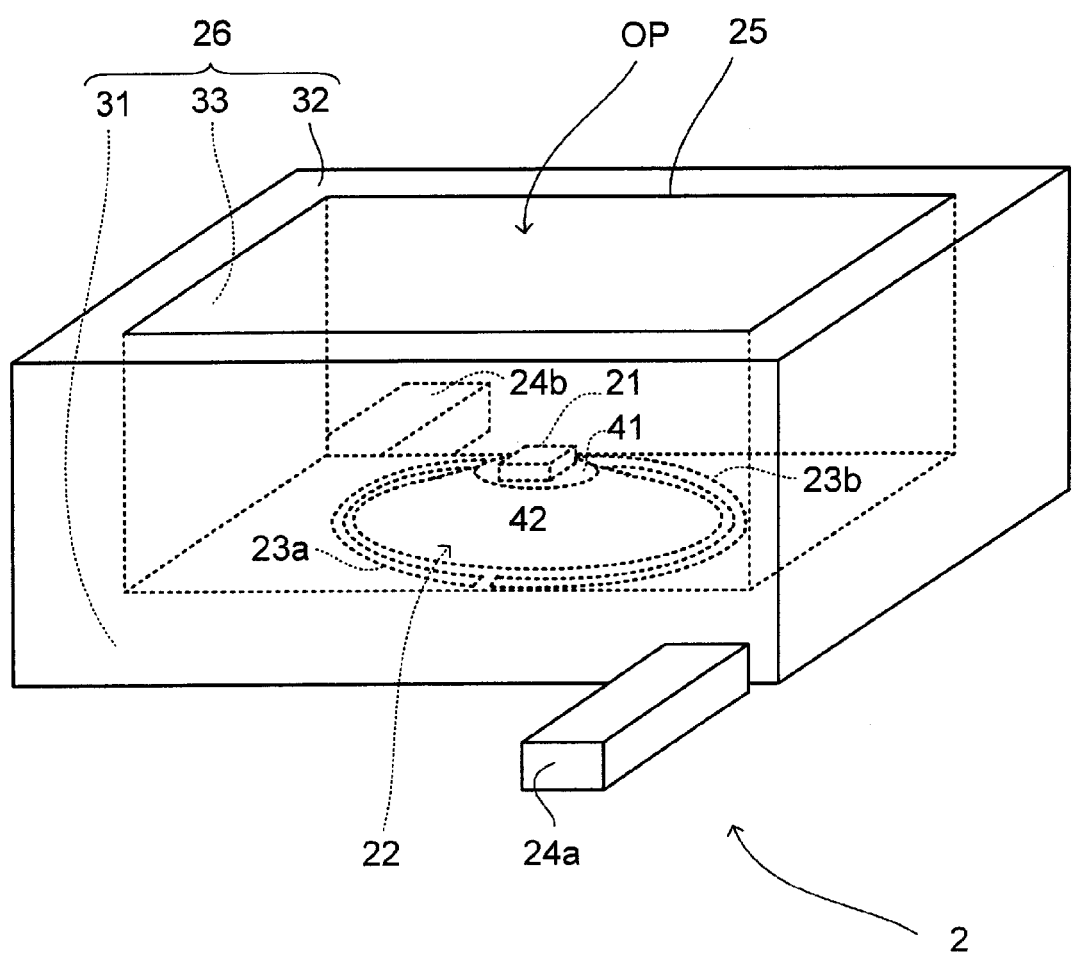
FIG. 14 is a perspective view showing another modification of the LEDs according to a preferred embodiment of the present invention illustrated in FIGS. 1, 13.

For example, the shape of the slug 22 is not limited to the tapered shape whose side surfaces 42a, 42b are arranged in a direction (the first direction R1) as shown in FIG. 1 etc. For example, as shown in FIG. 13, the slug 22 may be tapered into a pyramid (a conic solid; a truncated pyramid in detail) that has four side surfaces 42a-42d. Besides, as shown in FIG. 14, the slug 22 may be tapered into a circular cone (a conical solid; a circular truncated cone in detail).

As described above, because the slug 22 preferably has a raised shape with the support surface 41 used as the top, the side surface 42 defines the optical action surface 42 that receives a portion of the light from the light emitting chip 21 and reflects it. Accordingly, chances that the light traveling in elevation angle directions and the light traveling in depression angle directions reach the wall portions 32 of the package 26 decrease, thereby the light deterioration of the wall portions 32 can be prevented and minimized.

Besides, because the square pyramid-shape slug 22 shown in FIG. 13 has two pairs of side surfaces 42 opposing each other (the side surfaces 42a, 42b and the side surfaces 42c, 42d), there are two directions (directions S1, S2) in which the side surfaces 42 are arranged. Therefore, the emitted light from the LED 2 often travels in the two directions (if the number of angles of the pyramid increases, the emitted light travels radially).

Accordingly, there are the following three cases in which the optical action surfaces of the adjoining LEDs 2 of the LED array 1 arranged in a line oppose each other, and the optical action surfaces form a line:

In the LED array 1, the array direction P is given by arranging the directions S1 of the LEDs 2 in the same direction.

In the LED array 1, the array direction P is given by arranging the directions S2 of the LEDs 2 in the same direction.

In the LED array 1, the array direction P is given by arranging not only the directions S1 of several LEDs 2 in one same direction but also the directions S2 of the remaining LEDs 2 in the other same direction.

Because any one of the above three cases is achieved, and because the array direction P and the longitudinal direction of the side end the light guide plate 51 agree with each other, the light spreads over substantially the entire region in the longitudinal direction.

Because the circular cone-shape slug 22 shown in FIG. 14 has many pairs of side surfaces 42 opposing each other, there are many directions in which the side surfaces 42 are arranged. Therefore, the emitted light from the LED 2 easily travels radially. Also, because there are many directions in which the side surfaces 42 are arranged, the optical action surfaces of the adjoining LEDs 2 of the LED array 1 surely oppose each other. Accordingly, because the array direction P and the longitudinal direction of the side end of the light guide plate 51 agree with each other, the light spreads over substantially the entire region in the longitudinal direction.

In addition, the slugs 22 shown in FIGS. 13, 14 each have various sections including the perpendicular or substantially perpendicular line M. Because there is at least one section that meets the conditional expression A, functions and effects in a case where $\alpha$ is set to fall in the range defined by the conditional expression A are also obtained. It is needless to say that in the LED 2 and the LED array 1 that have the slugs 22 shown in FIGS. 13 and 14, the wall portions 32 of the package 26 and the lead frame may be provided.

Additionally, preferred embodiments obtained by suitably combining some of the technologies disclosed above are covered by the technical scope of the present invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A light emitting element comprising:
    a housing member including an opening;
    a light emitting chip; and
    a base portion arranged to support the light emitting chip in the housing member; wherein
    the housing member includes a bottom portion and a wall portion;
    a portion of an inner wall surface of the wall portion is a tilted surface inclined toward the opening;
    a portion adjacent to the opening of the inner wall surface of the wall portion is a surface perpendicular or substantially perpendicular to the bottom portion;
    the base portion includes a support surface arranged to support the light emitting chip;
    the base portion has a raised shape, the support surface is at the top of the raised surface, and an outer side surface of the raised shape defines an optical action surface that receives and reflects light emitted from the light emitting chip; and
    the base portion is arranged to protrude from the bottom portion of the housing member toward the opening and is tapered toward the support surface.

2. The light emitting element according to claim 1, wherein the tapered base portion is a conical solid member.

3. The light emitting element according to claim 1, further comprising:
    a light-transmissive sealing member; wherein
    a height H1 of the sealing member extending from the bottom surface of the housing member, and a height H2 of the wall portion of the housing member extending from the bottom surface of the housing member meet the following conditional expression:

$H1 \geq H2$.

4. The light emitting element according to claim 1, wherein a metal electrode which defines a path for an electric current flowing through the light emitting chip is provided on at least one of the bottom surface and the tilted surface of the housing member.

5. A light emitting element array comprising a plurality of the light emitting elements according to claim 1.

6. The light emitting element array according to claim 5, wherein
    the plurality of light emitting elements are arranged to be adjacent to one another; and
    the optical action surfaces of the adjacent light emitting elements oppose each other.

7. A backlight unit comprising:
    the light emitting element array according to claim 5; and
    a light guide plate arranged to receive light from the light emitting element array, and arranged to guide the light outside of the backlight.

8. A liquid crystal display device comprising a liquid crystal display panel arranged to receive the light guided by the backlight unit according to claim 7.

* * * * *